United States Patent
Kim et al.

(10) Patent No.: US 8,139,417 B2
(45) Date of Patent: Mar. 20, 2012

(54) FLASH MEMORY DEVICE AND READ METHOD

(75) Inventors: Hyung-gon Kim, Suwon-si (KR); Ki-hwan Choi, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 171 days.

(21) Appl. No.: 12/615,526

(22) Filed: Nov. 10, 2009

(65) Prior Publication Data

US 2010/0149877 A1 Jun. 17, 2010

(30) Foreign Application Priority Data

Dec. 17, 2008 (KR) .................. 10-2008-0128614

(51) Int. Cl.
*G11C 11/34* (2006.01)
(52) U.S. Cl. ......... 365/185.17; 365/185.18; 365/185.23; 365/185.29; 365/185.33
(58) Field of Classification Search ............. 365/185.17, 365/185.18, 185.23, 185.29, 185.33
See application file for complete search history.

(56) References Cited

U.S. PATENT DOCUMENTS

| | | | | |
|---|---|---|---|---|
| 6,940,759 B2 * | 9/2005 | Tsang et al. | ............ | 365/185.23 |
| 7,009,881 B2 * | 3/2006 | Noguchi | ............ | 365/185.17 |
| 7,342,831 B2 * | 3/2008 | Mokhlesi et al. | ........ | 365/185.23 |
| 7,433,236 B2 * | 10/2008 | Ha et al. | ............ | 365/185.18 |
| 7,463,515 B2 * | 12/2008 | Shirakawa et al. | ...... | 365/185.23 |
| 7,542,353 B2 * | 6/2009 | Park | ......................... | 365/185.29 |
| 7,787,306 B2 * | 8/2010 | Park et al. | ............ | 365/185.23 |
| 7,800,950 B2 * | 9/2010 | Park et al. | ............ | 365/185.17 |
| 7,817,473 B2 * | 10/2010 | Lee et al. | ............ | 365/185.17 |
| 7,821,832 B2 * | 10/2010 | Hahn | ....................... | 365/185.23 |
| 7,876,618 B2 * | 1/2011 | Lee et al. | ............ | 365/185.23 |
| 7,889,567 B2 * | 2/2011 | Park | ......................... | 365/185.23 |
| 7,907,446 B2 * | 3/2011 | Shimizu et al. | .......... | 365/185.23 |
| 7,948,797 B2 * | 5/2011 | Suzuki et al. | ........... | 365/185.17 |

FOREIGN PATENT DOCUMENTS

| | | | |
|---|---|---|---|
| JP | 2005285185 A | 10/2005 | |
| JP | 2005327409 A | 11/2005 | |
| KR | 100802059 B1 | 1/2008 | |

* cited by examiner

*Primary Examiner* — Trong Phan
(74) *Attorney, Agent, or Firm* — Volentine & Whitt, PLLC

(57) ABSTRACT

A flash memory device includes a word line decoder configured to receive a row address, and decode a selected word line and a neighboring non-selected word line corresponding to the row address during a read operation, and a word line driver configured to receive data identifying the selected word line and the neighboring non-selected word line from the word line decoder, and applying a read voltage to the selected word line, a first voltage to non-selected word lines other than the neighboring non-selected word line, and a second voltage to the neighboring non-selected word line.

20 Claims, 12 Drawing Sheets

FIG. 2
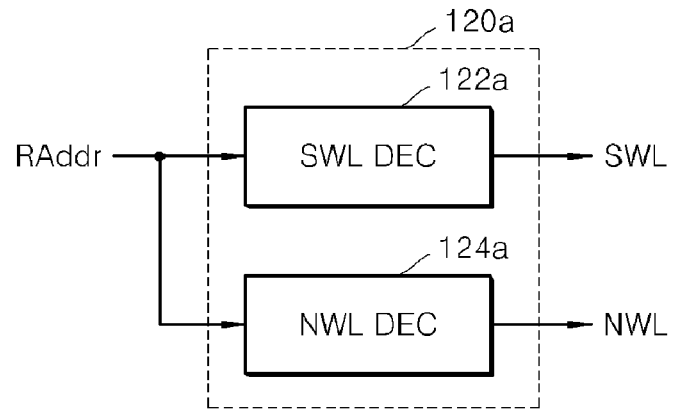
FIG. 3
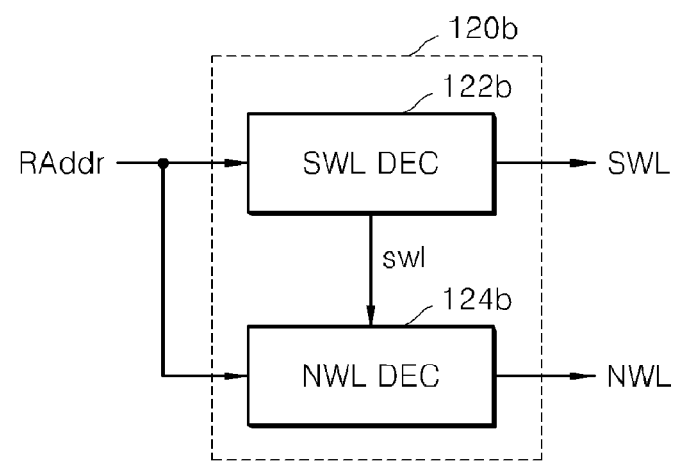
FIG. 4
| NWL \ SWL | "H" | "L" |
|---|---|---|
| "H" | – | V2 |
| "L" | $V_R$ | V1 |

FLASH MEMORY DEVICE AND READ METHOD

CROSS-REFERENCE TO RELATED APPLICATION

This U.S. non-provisional patent application claims the benefit of Korean Patent Application No. 10-2008-0128614 filed on Dec. 17, 2008, the subject matter of which is hereby incorporated by reference.

BACKGROUND

The inventive concept relates generally to flash memory devices. More particularly, the inventive concept relates to flash memory devices that drive different voltages onto a selected word line, and a neighboring non-selected word line amongst a plurality of non-selected word lines, and another non-neighboring, non-selected word line amongst the plurality of non-selected word lines, thereby preventing a decrease in cell current and distortion of cell threshold voltage otherwise occurring in the neighboring non-selected word line.

Flash memory is one type of non-volatile memory and may be broadly classified as NAND flash memory and NOR flash memory. As is conventionally understood, read and write operations are performed in NAND flash memory in page units. Further, NAND flash memory is configured with a structure in which memory cells are serially connected in a string. This structure, while offering many performance and fabrication advantages, also suffers from certain interference effects between adjacent or proximately located memory cells.

SUMMARY

According to an aspect of the inventive concept, a flash memory device comprises; a word line decoder configured to receive a row address, and decode a selected word line and a neighboring non-selected word line corresponding to the row address during a read operation, and a word line driver configured to receive data identifying the selected word line and the neighboring non-selected word line from the word line decoder, and applying a read voltage to the selected word line, a first voltage to non-selected word lines other than the neighboring non-selected word line, and a second voltage to the neighboring non-selected word line.

In a related aspect the word line decoder may comprise a first sub-decoder configured to receive the row address and decode the selected word line, and a second sub-decoder configured to receive the row address and decode the neighboring non-selected word line.

According to another aspect of the inventive concept, a flash memory device comprises; a word line decoder configured to receive a row address, and decode a selected word line, a first neighboring non-selected word line, and a second neighboring non-selected word line corresponding to the row address during a read operation, and a word line driver configured to receive data identifying the selected word line, the first neighboring non-selected word line, and the second neighboring non-selected word line from the word line decoder, and apply a read voltage to the selected word line, a first voltage to non-selected word lines other than the first and second neighboring non-selected word lines, a second voltage to the first neighboring non-selected word line, and a third voltage to the second neighboring non-selected word line.

According to an aspect of the inventive concept, a memory system comprises; a flash memory device and a memory controller configured to read data from the flash memory device, wherein the flash memory device comprises; a word line decoder configured to receive a row address, and decode a selected word line and a neighboring non-selected word line corresponding to the row address during a read operation, and a word line driver configured to receive data identifying the selected word line and the neighboring non-selected word line from the word line decoder, and applying a read voltage to the selected word line, a first voltage to non-selected word lines other than the neighboring non-selected word line, and a second voltage to the neighboring non-selected word line.

According to another aspect of the inventive concept, a method of reading data in the flash memory device comprises; receiving the row address and decoding a selected word line and a neighboring non-selected word line, and in response to data identifying the selected word line and the neighboring non-selected word line, applying a read voltage to the selected word line, a first voltage to non-selected word lines other than the neighboring non-selected word line, and a second voltage to the neighboring non-selected word line.

BRIEF DESCRIPTION OF THE DRAWINGS

Embodiments of the inventive concept will be more clearly understood from the following detailed description taken in conjunction with the accompanying drawings in which:

FIG. 2 is a block diagram further illustrating the word line decoder of FIG. 1 according to an embodiment of the inventive concept;

FIG. 3 is a block diagram further illustrating another version of the word line decoder of FIG. 1 according to another embodiment of the inventive concept;

FIG. 4 is a table of voltages applied to the word lines of the flash memory device of FIG. 1;

DESCRIPTION OF EMBODIMENTS

The inventive concept will now be described more fully with reference to the accompanying drawings in which exemplary embodiments of the inventive concept are shown. Throughout the written description and drawings, like reference numbers and labels are used to denote like or similar elements.

Figure 1:
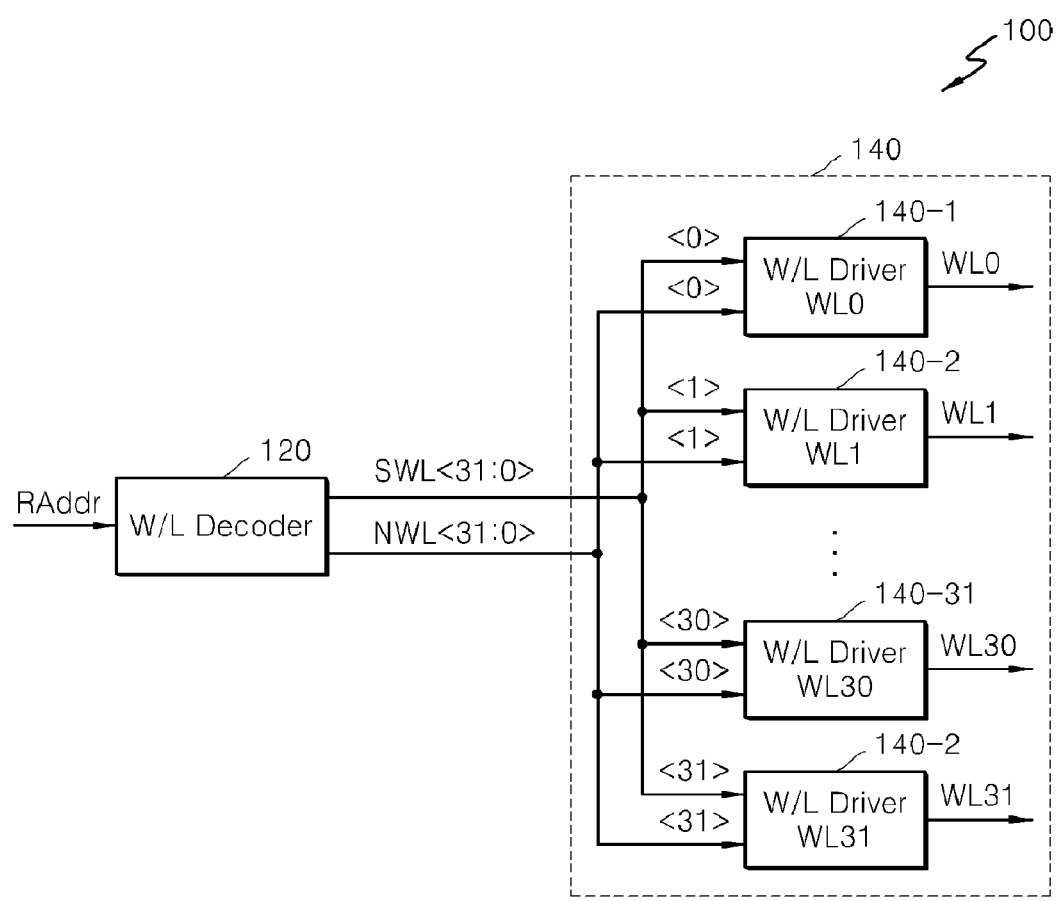
FIG. 1 is a diagram illustrating part of a flash memory device according to an embodiment of the inventive concept.

FIG. 1 is a diagram illustrating part of a flash memory device 100 according to an embodiment of the inventive concept.

Referring to FIG. 1, the flash memory device 100 comprises a word line decoder 120 and a word line driver 140. The illustrated embodiment assumes that the flash memory device 100 is a NAND flash memory.

The word line decoder 120 receives a row address RAddr and decodes the row address RAddr to identify a selected word line SWL corresponding to the row address RAddr. In particular, the word line decoder 120 decodes the row address RAddr into a 32-bit word line. Also, the word line decoder 120 decodes the row address RAddr to not only identify the selected word line SWL, but also to identify at least one "neighboring word line" NWL—that is, at least one non-selected word line from the plurality of non-selected word lines disposed adjacent (or proximate) the selected word line SWL. In this context the term "adjacent" means a word line physically laid out next to the selected word line, while "proximate" means a world line physically laid out close to the selected word line, but separated by one of more intervening word lines.

FIG. 2 is a block diagram further illustrating a word line decoder 120a adapted for use in the flash memory device 100 of FIG. 1 according to an embodiment of the inventive concept. FIG. 3 is a block diagram further illustrating another word line decoder 120b also adapted for used in the flash memory device 100 of FIG. 1 according to another embodiment of the inventive concept.

Referring to FIG. 2, the word line decoder 120a of FIG. 2 comprises a first sub-decoder 122a and a second sub-decoder 124a. The first sub-decoder 122a decodes a row address RAddr into a selected word line SWL that corresponds to the row address RAddr, and the second sub-decoder 124a decodes a row address RAddr into a neighboring non-selected word line NWL that corresponds to the row address RAddr.

For example, the first sub-decoder 122a may decode a word line "N" corresponding to a row address RAddr "A" into a selected word line SWL, and the second sub-decoder 124a may decode at least one non-selected word lines "N−1" and/or "N+1" respectively corresponding to row addresses RAddr "A−1" and "A+1" into a neighboring non-selected word line NWL.

In a slightly different configuration, the word line decoder 120b of FIG. 3 comprises a first sub-decoder 122b and a second sub-decoder 124b but, unlike the word line decoder 120a of FIG. 2, the second sub-decoder 124b of the word line decoder 120b of FIG. 3 decodes a neighboring non-selected word line NWL by referring to a selected word line ("swl") received from the first sub-decoder 122b.

For example, the first sub-decoder 122b may decode a word line "N" corresponding to a row address RAddr into a selected word line SWL, and the second sub-decoder 124b may decode at least one non-selected word lines "N−1" and/or "N+1" into a neighboring word line NWL using the selected word line SWL indication provided by the first sub-decoder 122b.

Referring back to FIG. 1, the word line driver 140 includes a plurality of sub-word line drivers 140-1 through 140-32. The sub-word line drivers 140-1 through 140-32 respectively apply voltages to word lines respectively corresponding to the sub-word line drivers 140-1 through 140-32. As illustrated in FIG. 4, when a corresponding word line is a selected word line SWL (that is, SWL "H" & NWL "L"), each of the sub-word line drivers 140-1 through 140-32 of the flash memory device 100 drives a read voltage VR onto the corresponding word line, and when a corresponding word line is a neighboring non-selected word line NWL (that is, SWL "L" & NWL "H"), each of the sub-word line drivers 140-1 through 140-32 drives a second voltage V2 onto the corresponding word line.

Also, when a corresponding word line is neither the selected word line SWL nor the neighboring non-selected word line NWL (that is, SWL "L" & NWL "L"), each of the sub-word line drivers 140-1 through 140-32 drives a first voltage V1 onto the corresponding word line. That is, the flash memory device 100 respectively applies different voltages to the selected word line SWL, one or more neighboring non-selected word line(s) NWL(s) (i.e., one or more non-selected word lines adjacent to the selected word line SWL), and all remaining non-selected and non-neighboring word lines.

Figure 5:
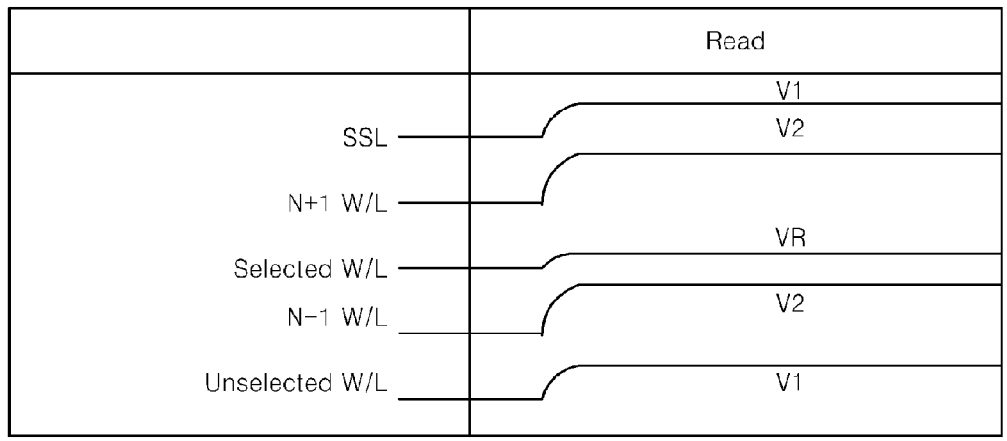
FIG. 5 is a graph further illustrating of voltages listed in the table of FIG. 4.

As illustrated in FIG. 5, a second voltage V2 applied to neighboring non-selected word lines N+1 W/L and N−1 W/L has a level higher than the level of the first voltage V1 applied to non-selected, non-neighboring word lines W/L. Since the second voltage V2 applied to the neighboring word lines N+1 W/L and N−1 W/L is higher than the first voltage V1 applied to the non-selected, non-neighboring word lines W/L, a decrease in memory cell current due to a line-to-line parasitic capacitance "C" is prevented. See, FIG. 6.

Figure 6:
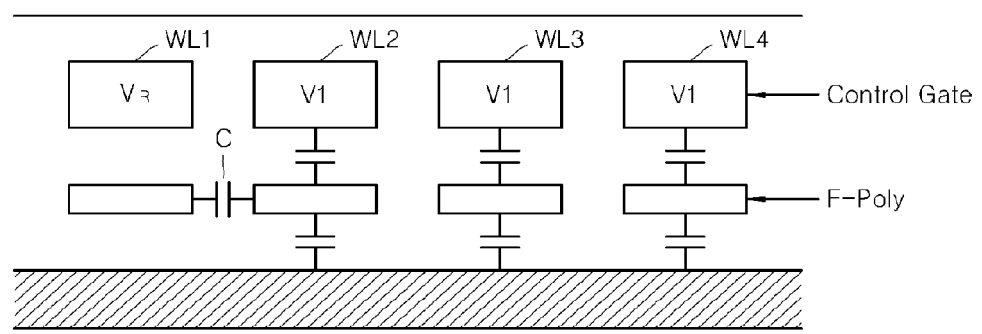
FIG. 6 is a conceptual diagram illustrating an interference problem that occurs between a selected word line and a neighboring word line adjacent to a selected word line.

Referring to FIG. 6, when a flash memory device performs a read operation with equal voltages applied to all non-selected word lines (including neighboring word lines), a capacitance coupling ratio between a control gate and an F-poly layer in a neighboring word line WL2 adjacent to a selected word line WL1 is smaller than a control gate in non-selected, non-neighboring word lines WL3 and WL4. Thus, where all non-selected, non-neighboring word lines (e.g., WL3 and WL4) have the first voltage V1 applied thereto, a resulting line-to-line parasitic capacitance "C" may be ignored. However, a significant line-to-line parasitic capacitance "C" is generated between a neighboring word line (e.g., WL2) due to a difference between the high first voltage V1 applied to the non-selected word lines WL3 and WL4 and a low read voltage VR applied to the selected word line WL1.

When the coupling ratio between the control gate and the F-poly is decreased, there is a decrease in cell current for a corresponding memory cell. However, the flash memory device 100 applies a high second voltage V2 to the neighboring non-selected word line NWL and which is sufficient to compensate for the coupling ratio decreases due to the line-to-line capacitance "C". Thus, the aforementioned problem may be prevented. For example, if the coupling ratio is decreased by about 10% due to the line-to-line capacitance "C", a voltage 1.1 times higher than the read voltage may be applied to the neighboring word line so as to compensate for this decrease.

In this manner, by applying a higher voltage to a neighboring non-selected word line, the voltages applied to the non-selected word lines are relatively decreased so that an average read voltage with respect to all word lines may be decreased.

Figure 7:
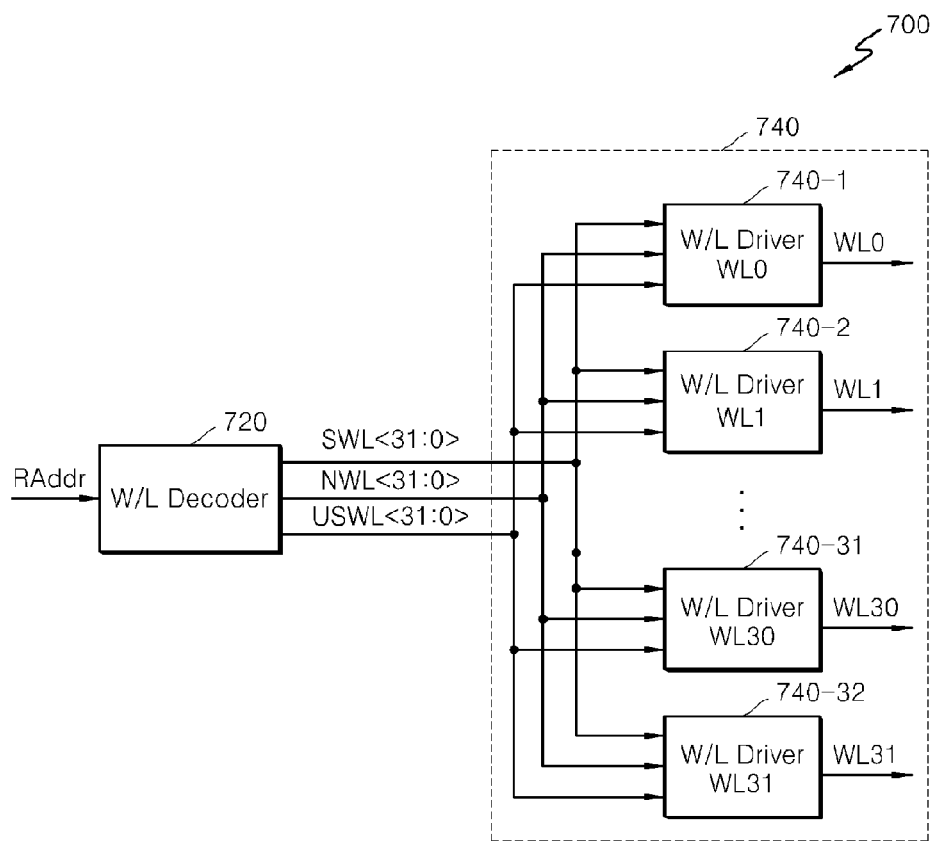
FIG. 7 is a diagram illustrating part of a flash memory device according to another embodiment of the inventive concept.

FIG. 7 is a diagram illustrating part of a flash memory device 700 according to another embodiment of the inventive concept.

Referring to FIG. 7, the flash memory device 700 includes a word line decoder 720 and a word line driver 740.

The word line decoder 720 receives a row address RAddr and decodes the row address RAddr into a selected word line SWL that corresponds to the row address RAddr. In addition to the selected word line SWL, the word line decoder 720 also decodes a neighboring non-selected word line NWL adjacent (or proximate to) the selected word line SWL. Unlike the word line decoder 120 of FIG. 1, however, the word line decoder 720 of FIG. 7 decodes not only at least one neighboring, non-selected word line NWL, but also at least one non-neighboring, non-selected word line USWL.

Figure 8:
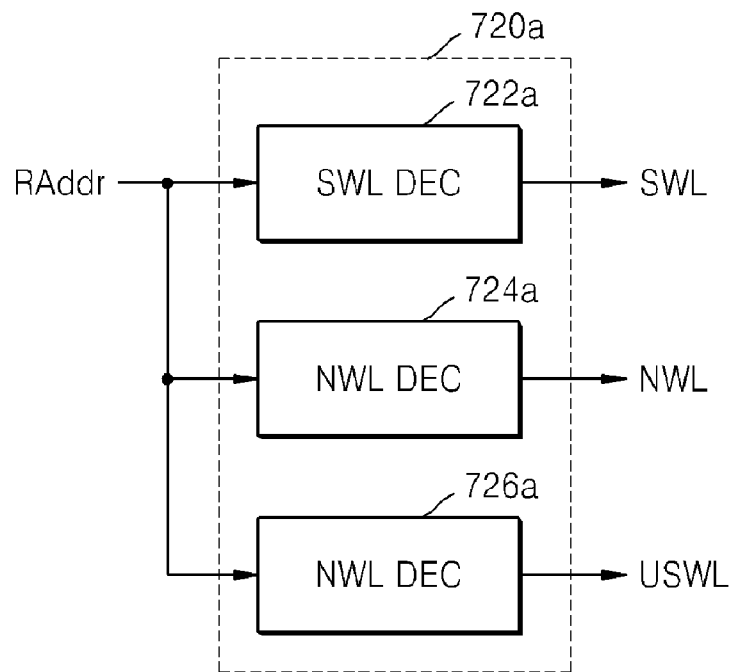
FIG. 8 is a block diagram further illustrating the word line decoder of FIG. 7 according to an embodiment of the inventive concept.

Thus, as shown in FIG. 8 which illustrates a word line decoder 720a as one possible version of the word line decoder 720 of FIG. 7, the word line decoder 720a comprises a third sub-decoder 726a in addition to a first sub-decoder 722a and a second sub-decoder 724a. The first sub-decoder 722a decodes a row address RAddr into a selected word line SWL that corresponds to the row address RAddr, and the second sub-decoder 724a decodes at least one neighboring word line NWL by using the row address RAddr. Also, the third sub-decoder 726a decodes at least one non-neighboring, non-selected word line USWL using the row address RAddr.

For example, the first sub-decoder 722a decodes a row address RAddr "A" into a selected word line SWL "N" that corresponds to the row address RAddr "A", and the second sub-decoder 724a decodes a row address "A+1" or "A−1" into corresponding neighboring, non-selected word line NWL "N+1" or "N−1". When a first row address indicates a word line "0" and a last row address indicates a word line "Z", the third sub-decoder 726a may decode the word line "0" through a word line "A−2" and a word line "A+2" through the word line "Z" into non-selected non-neighboring word lines USWL.

Figure 9:
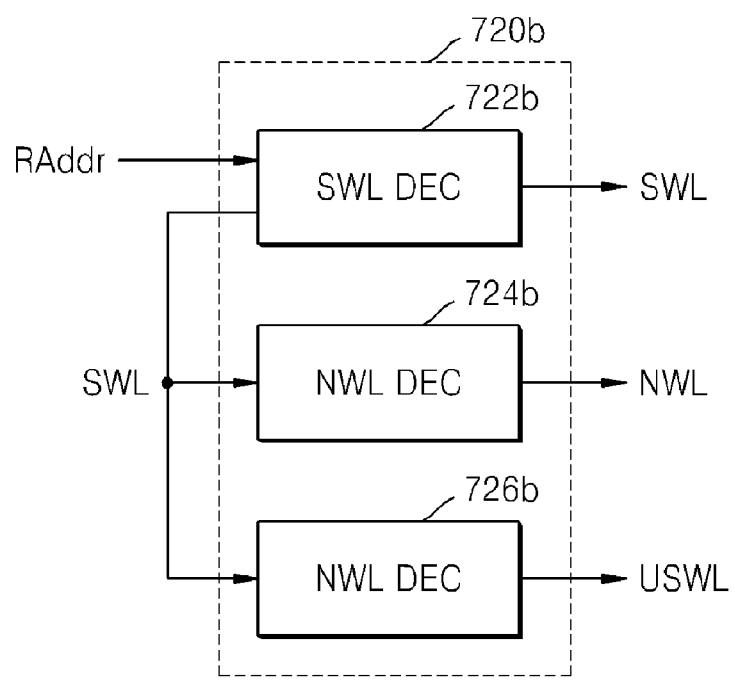
FIG. 9 is a block diagram further illustrating another version of the word line decoder of FIG. 7 according to another embodiment of the inventive concept.

On the other hand, as shown in FIG. 9, which illustrates a word line decoder 720b according to another possible version of the word line decoder 720 of FIG. 7, the word line decoder 720b similarly comprises a first sub-decoder 722b, a second sub-decoder 724b, and a third sub-decoder 726b. However, unlike the word line decoder 720a of FIG. 8, the second sub-decoder 724b and the third sub-decoder 726b of the word line decoder 720b of FIG. 9 respectively decode at least one neighboring non-selected word line NWL and a non-neighboring, non-selected word line USWL using a selected word line SWL received from the first sub-decoder 722b.

For example, the first sub-decoder 722b may decode a word line "N" corresponding to a row address RAddr into a selected word line SWL, and the second sub-decoder 724b may decode at least one neighboring non-selected word line "N−1" and a word line "N+1", which are respectively adjacent to the selected word line SWL "N", into a neighboring non-selected word line(s) NWL. Also, when a first word line indicates a word line "0" and a last word line indicates a word line "M", the third sub-decoder 726b decodes the word line "0" through a word line "N−2" and a word line "N+2" through the word line "M" into non-neighboring, non-selected word lines USWL.

Referring back to FIG. 7, similar to the embodiment illustrated in FIG. 1, the word line driver 740 of FIG. 7 includes a plurality of sub-word line drivers 740-1 through 740-32. The sub-word line drivers 740-1 through 740-32 respectively apply voltages to word lines respectively corresponding to the sub-word line drivers 740-1 through 740-32.

Thus, similar to the embodiment illustrated in FIG. 1, when a corresponding word line is a selected word line SWL (that is, SWL "H" & NWL "L"), each of the sub-word line drivers 740-1 through 740-32 of FIG. 7 drives a read voltage VR to the corresponding word line, and when a corresponding word line is a neighboring, non-selected word line NWL (that is, SWL "L" & NWL "H"), each of the sub-word line drivers 740-1 through 740-32 drives a second voltage V2 to the corresponding word line.

On the other hand, when a corresponding word line is a non-selected, non-neighboring word line USWL, each of the sub-word line drivers 740-1 through 740-32 of FIG. 7 drives a first voltage V1 to the corresponding word line in response to a logic level of the non-selected word line USWL, instead of in response to logic levels of a selected word line and a neighboring non-selected word line as is the case with FIGS. 1 and 4. As described above, the second voltage V2 is higher than the first voltage V1, and thus, the flash memory device 700 of FIG. 7 is capable of compensating for a decreased coupling ratio due to a corresponding line-to-line parasitic capacitance.

Figure 10:
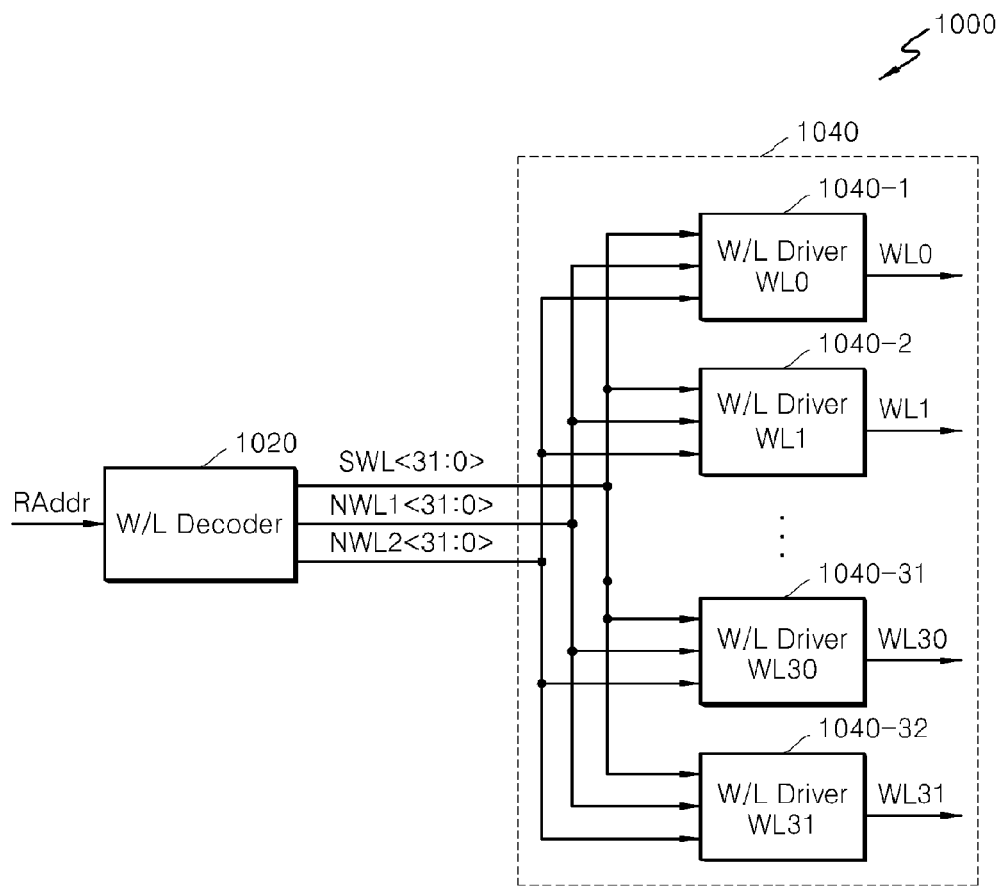
FIG. 10 is a diagram illustrating part of a flash memory device according to yet another embodiment of the inventive concept.

FIG. 10 is a diagram illustrating part of a flash memory device 1000 according to yet another embodiment of the inventive concept.

Referring to FIG. 10, like the flash memory device 100 of FIG. 1, the flash memory device 1000 of FIG. 10 includes a word line decoder 1020 and a word line driver 1040. However, unlike the flash memory device 100 of FIG. 1 in which the word line decoder 120 decodes a selected word line and at least one neighboring, non-selected word line, the word line decoder 1020 of FIG. 10 decodes a selected word line SWL, a first neighboring, non-selected word line NWL1, and a second neighboring, non-selected word line NWL2. In this embodiment, the second neighboring, non-selected word line NWL2 is word line that is proximate to (e.g., adjacent to) the first neighboring, non-selected word line NWL1. Thus, "proximity" for a neighboring non-selected word NWLn line may be defined in relation to the selected word line SWL (per the embodiment of FIG. 1), or in relation to an identified neighboring, non-selected word line NWLm.

Figure 11:
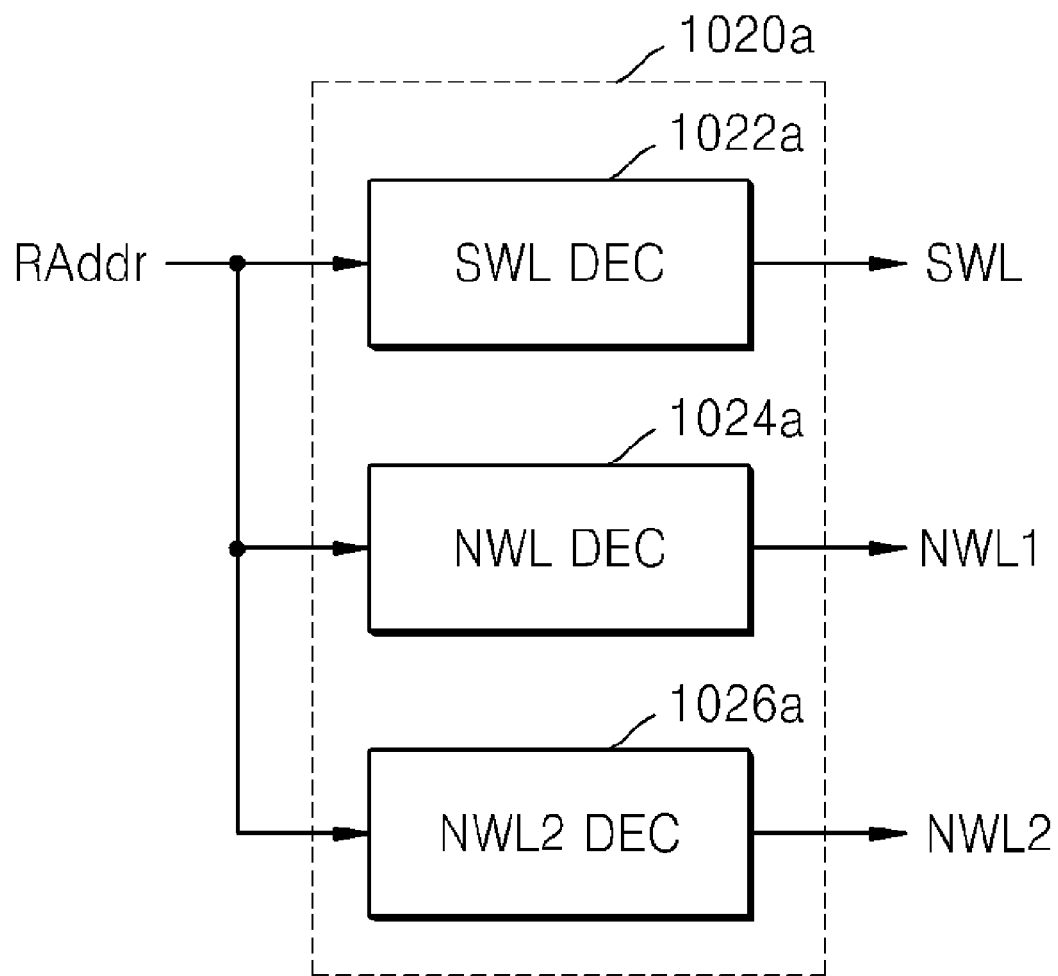
FIG. 11 is a block diagram further illustrating the word line decoder of FIG. 10 according to an embodiment of the inventive concept.

Thus, as shown in FIGS. 11 and 12 that illustrate word line decoders 1020a, 1020b, and 1020c as possible variations of word line decoder 1020 of FIG. 10, the word line decoders 1020a, 1020b, and 1020c respectively include first sub-decoders 1022a, 1022b, and 1022c for decoding the selected word line SWL, second sub-decoders 1024a, 1024b, and 1024c for decoding the first neighboring non-selected word line(s) NWL1, and third sub-decoders 1026a, 1026b, and 1026c for decoding the second neighboring, non-selected word line(s) NWL2.

The third sub-decoder 1026a of FIG. 11 may decode a second neighboring, non-selected word line NWL2 using a row address RAddr, similar to the manner in which a neighboring non-selected word line NWL is decoded in the embodiment illustrated in FIG. 2. Here, the second neighboring, non-selected word line NWL2 may be a word line "N+2" or a word line "N−2" respectively corresponding to a row address "A+2" or a row address "A−2".

Figure 12A:
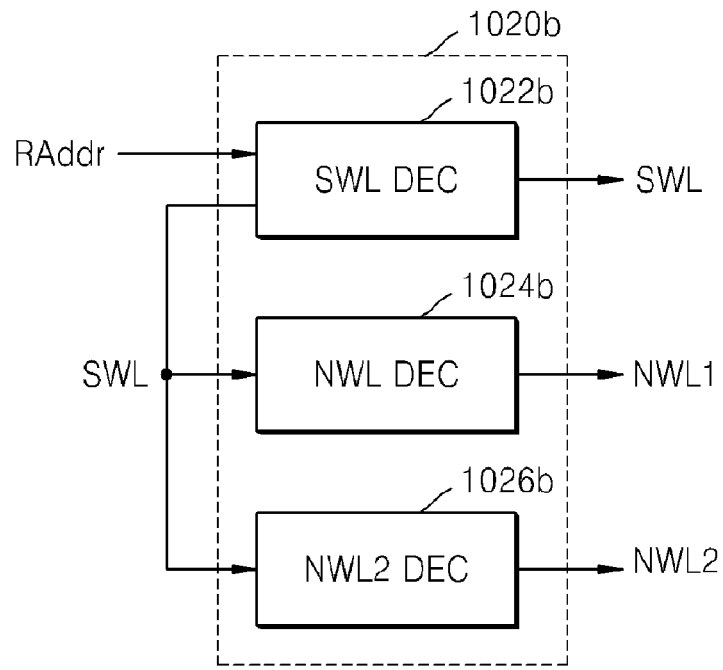
FIGS. 12A and 12B are block diagrams further illustrating other versions of the word line decoder of FIG. 10 according to embodiments of the inventive concept.

The third sub-decoder 1026b shown in FIG. 12A may be used to decode a second neighboring, non-selected word line NWL2 using a selected word line SWL, similar to the manner in which a neighboring, non-selected word line NWL is decoded in the embodiment shown in FIG. 3. Here, the selected word line "N" is decoded into the second neighbor word line NWL2 that is at least one of a word line "N−2" and a word line "N+2".

Figure 12B:
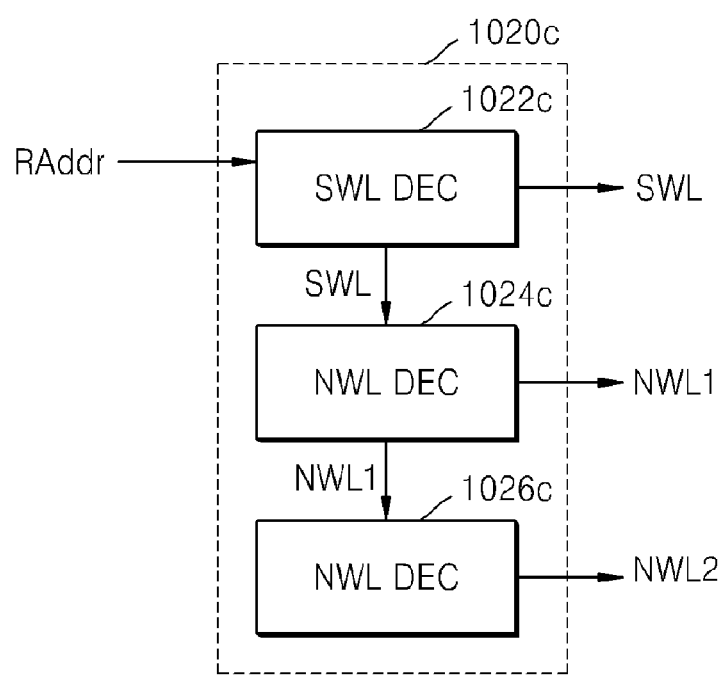

The third sub-decoder 1026c of FIG. 12B is similar to the third sub-decoder 1026b of FIG. 12A, but may decode the second neighboring, non-selected word line NWL2 by using a first neighboring, non-selected word line NWL1 instead of using the selected word line SWL. Here, first neighboring, non-selected word lines "N−1" and "N+1" may be decoded into second neighboring, non-selected word line NWL2 that is at least one of the word line "N−2" and the word line "N+2".

Referring back to FIG. 10, the word line driver 1040 includes a plurality of sub-word line drivers 1040-1 through 1040-32. The sub-word line drivers 1040-1 through 1040-32 respectively apply voltages to word lines respectively corresponding to the sub-word line drivers 1040-1 through 1040-32.

Figure 13:
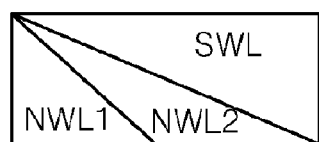
FIG. 13 is a table listing voltages applied to the word lines the flash memory device of FIG. 10.

As illustrated in FIG. 13, when a corresponding word line is a selected word line SWL (that is, SWL "H" & NWL1 "L" & NWL2 "L"), each of the sub-word line drivers 1040-1 through 1040-32 of the flash memory device 1000 according to the embodiment of FIG. 10 drives a read voltage VR onto the corresponding word line, and when a corresponding word line is a first neighboring, non-selected word line NWL1 or a second neighboring, non-selected word line NWL2 (that is, SWL "L" & NWL1 "H" & NWL2 "L" or SWL "L" & NWL1 "L" & NWL2 "H"), each of the sub-word line drivers 1040-1 through 1040-32 drives a second voltage V2 onto the corresponding word line.

As described above, when a corresponding word line is neither a selected word line SWL nor a neighboring, non-selected word line NWL (that is, SWL "L" & NWL1 "L" & NWL2 "L"), each of the sub-word line drivers 1040-1 through 1040-32 drives a first voltage V1 to the corresponding word line.

Figures 14, 15:
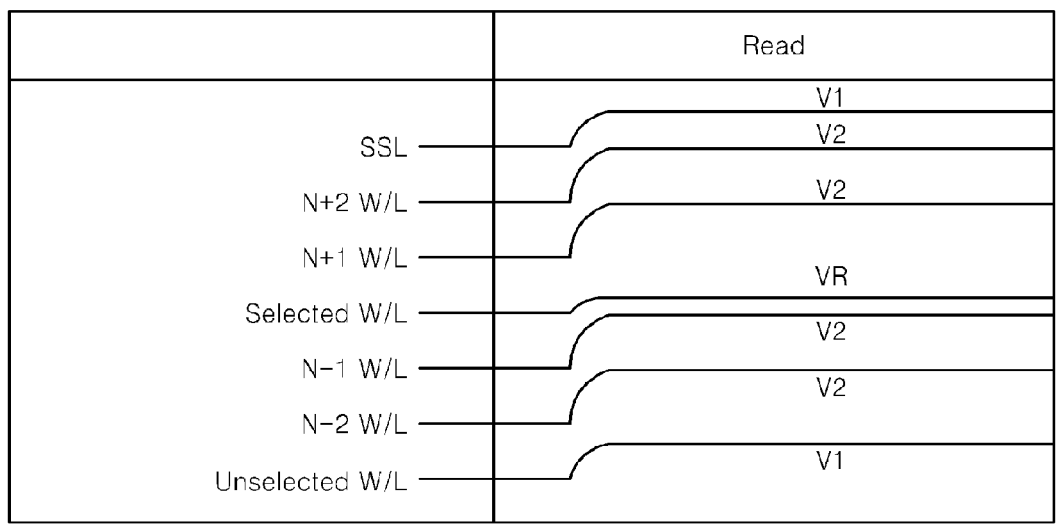
FIG. 14 is a graph further illustrating the voltages listed in the table of FIG. 13.
FIG. 15 is another table listing voltages applied to the word lines of the flash memory device of FIG. 10.

As further illustrated in FIGS. 13 and 14, the second voltage V2 applied to first neighboring, non-selected word lines N+1 W/L and N−1 W/L may be equal to the second voltage V2 applied to second neighboring, non-selected word lines N+2 W/L and N−2 W/L. The second voltages V2 is higher than the first voltage V1 applied to non-selected word lines W/L which are not (first or second) neighboring word lines.

Figure 16:
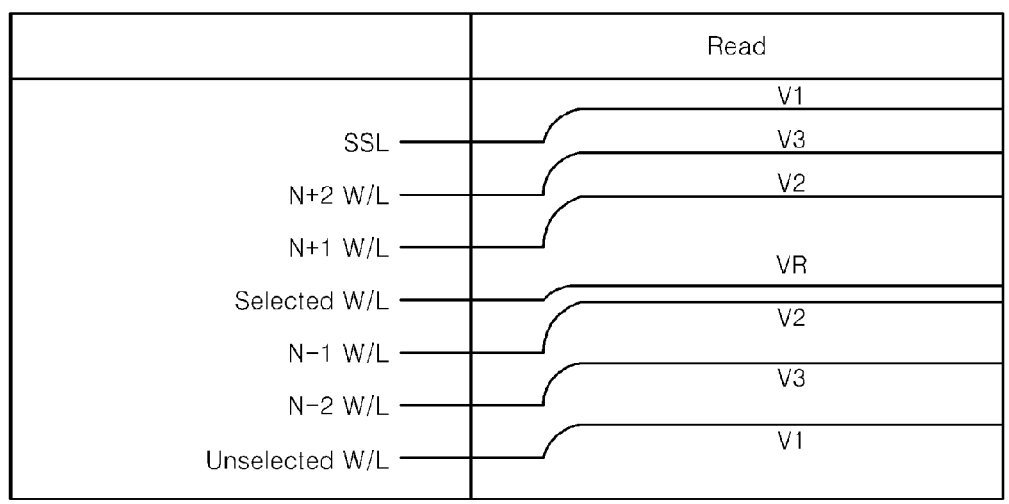
FIG. 16 is a graph further illustrating the voltages listed in the table of FIG. 15.

In contrast and with reference to FIGS. 15 and 16, the second voltage V2 may be applied to first neighboring, non-selected word lines N+1 W/L and N−1 W/L, and a third voltage V3, different from the second voltage V2, may be applied to the second neighboring, non-selected word lines N+2 W/L and N−2 W/L. Both of the second voltage V2 and the third voltage V3 is higher than a first voltage V1 applied to other non-selected word lines W/L which are not (first or second) neighboring word lines.

The second voltage V2 may be higher than the third voltage V3, but embodiments of the inventive concept are not limited thereto. In this regard, the respective magnitudes of the second voltage V2 and the third voltage V3 may be determined to decrease the effects of the actual line-to-line parasitic capacitance within flash memory devices according to embodiments of the invention.

Figure 17:
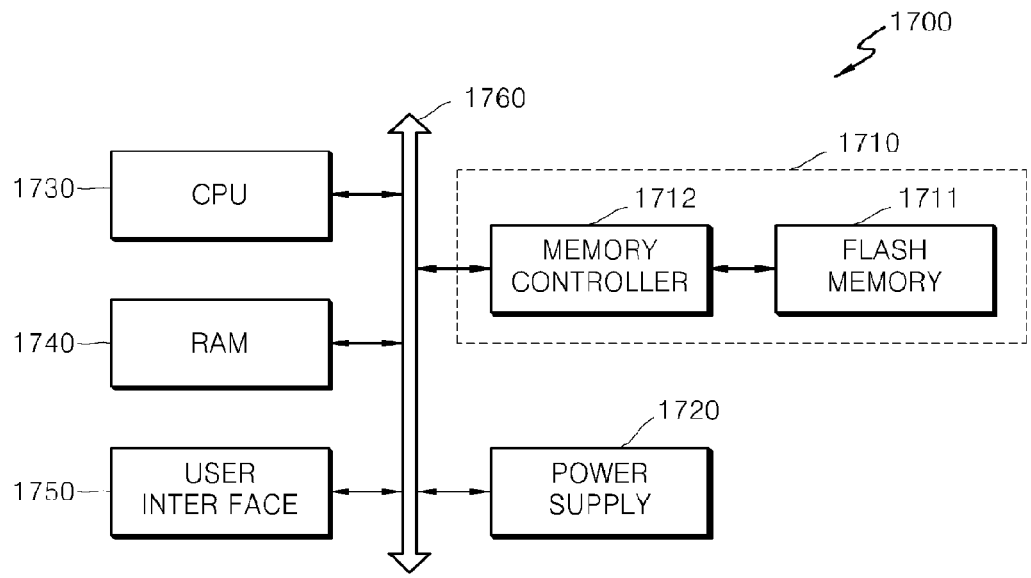
FIG. 17 is a block diagram of a computational system incorporating a flash memory device according to an embodiment of the inventive concept.

FIG. 17 is a block diagram of a computational system 1700 incorporating a flash memory device according to an embodiment of the inventive concept.

The computational system 1700 comprises a microprocessor (CPU) 1730, a user interface 1750, and a memory system device 1710 including a memory controller 1712 and a flash memory device 1711, which are electrically connected to a bus 1760. The flash memory device 1711 may have stored therein N-bit data, where N is a positive integer, via the memory controller 1712, wherein the N-bit data is processed or is to be processed by the CPU 1730. The computational system 1700 may further include a random access memory (RAM) 1740 and power supply 1720.

In a case where the computational system 1700 is a mobile apparatus, a battery and a modem such as a baseband chipset may be additionally provided to supply an operating power to the system. Also, as is well known to one of ordinary skill in the art, an application chipset, a camera image processor (CIS), a mobile dynamic random access memory (DRAM), or the like may be additionally provided to supply an operating power to the computational system 1700.

The memory controller 1712 and the flash memory device 1711 may form a solid state drive/disk (SSD) that uses a non-volatile memory so as to store data.

Figure 18:
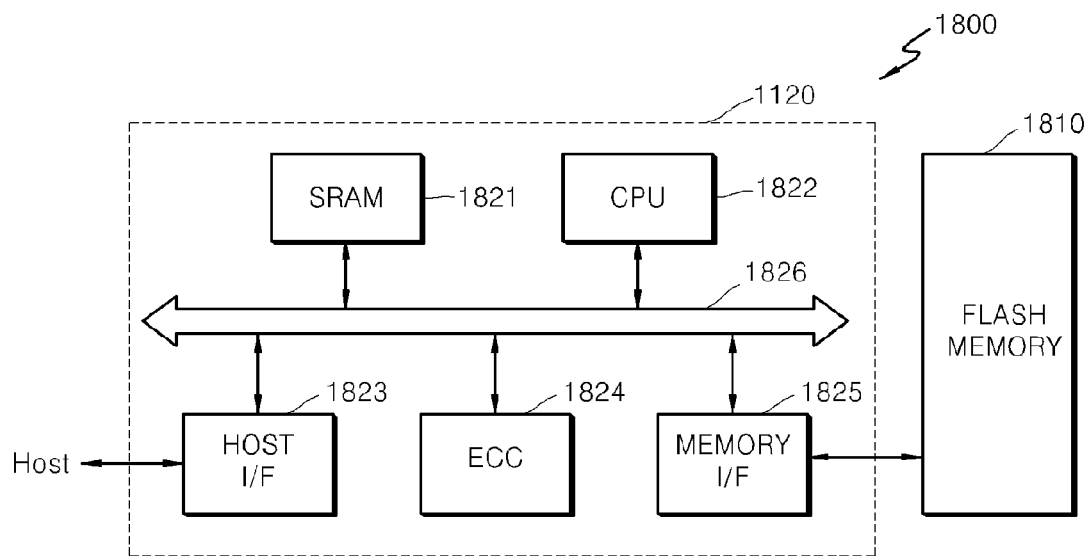
FIG. 18 is a block diagram of a memory card incorporating a flash memory device according to an embodiment of the inventive concept.

The flash memory device 1711 (refer to a flash memory 1810 of FIG. 18) and a memory controller 1820 may form a memory card 1800, as illustrated in FIG. 18. In this case, the memory controller 1820 may be configured to communicate with an external source (e.g., a host) via one of various interface protocols including USB, MMC, PCI-E, SATA, PATA, SCSI, ESDI, IDE, and the like. The memory controller 1820 of FIG. 18 includes a CPU 1822, an SRAM 1821, a HOST I/F 1823, an ECC 1824, a MEMORY I/F 1825, and a bus 1826, which are well known to one of ordinary skill in the art with respect to their structures and operations. Thus, detailed descriptions thereof will be omitted here.

The flash memory device according to the embodiments of the present invention may be mounted by using one of various types of packages. For example, the flash memory device according to the embodiments of the present invention may be mounted by using one of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

While the inventive concept has been particularly shown and described with reference to exemplary embodiments thereof, it will be understood that various changes in form and details may be made therein without departing from the scope of the following claims.

What is claimed is:

1. A flash memory device, comprising:
a word line decoder configured to comprise a first sub-decoder receiving a row address and decoding a selected word line, and a second sub-decoder decoding a neighboring non-selected word line which is distinguished from a non-neighboring and non-selected word line during a read operation; and
a word line driver configured to receive data identifying the selected word line and the neighboring non-selected word line from the word line decoder, and applying a read voltage to the selected word line, a first voltage to the non-neighboring and non-selected word line, and a second voltage to the neighboring non-selected word line.

2. The flash memory device of claim 1, wherein
the second sub-decoder is configured to receive the row address and decode the neighboring non-selected word line corresponding to the row address.

3. The flash memory device of claim 1, wherein
the second sub-decoder is configured to receive data identifying the selected word line from the first sub-decoder and decode the neighboring non-selected word line corresponding to the data identifying the selected word line.

4. The flash memory device of claim 1, wherein the word line driver comprises a plurality of sub-word line drivers each respectively configured to receive data identifying the selected word line and the neighboring non-selected word line from the word line decoder, and apply a voltage selected from a group of voltages including a read voltage, a first voltage, and a second voltage to a corresponding word line.

5. The flash memory device of claim 1, wherein the second voltage is higher than the first voltage.

6. The flash memory device of claim 1, wherein the neighboring non-selected word line is adjacent to the selected word line.

7. A flash memory device, comprising:
a word line decoder configured to comprise a first sub-decoder receiving a row address and decoding a selected word line, a second sub-decoder decoding a first neighboring non-selected word line, and a third sub-decoder decoding a second neighboring non-selected word line which is distinguished from a non-neighboring and non-selected word line during a read operation; and
a word line driver configured to receive data identifying the selected word line, the first neighboring non-selected word line, and the second neighboring non-selected word line from the word line decoder, and apply a read voltage to the selected word line, a first voltage to the non-neighboring and non-selected word line, a second voltage to the first neighboring non-selected word line, and a third voltage to the second neighboring non-selected word line.

8. The flash memory device of claim 7, wherein the third voltage is equal to the second voltage.

9. The flash memory device of claim 7, wherein the third voltage is different from the second voltage.

10. The flash memory device of claim 7, wherein both the second voltage and the third voltage are higher than the first voltage.

11. The flash memory device of claim 7, wherein
the second sub-decoder is configured to receive at least one of the row address and data identifying the selected word line, and decode the first neighboring non-selected word line; and
the third sub-decoder is configured to receive at least one of the row address, data identifying the selected word line, and data identifying the first neighboring non-selected word line, and decode the second neighboring non-selected word line.

12. A memory system, comprising:
a flash memory device and a memory controller configured to read data from the flash memory device, wherein the flash memory device comprises:
a word line decoder configured to comprise a first sub-decoder receiving a row address and decoding a selected word line, and a second sub-decoder decoding a neighboring non-selected word line which is distinguished from non-neighboring and non-selected word line during a read operation; and
a word line driver configured to receive data identifying the selected word line and the neighboring non-selected word line from the word line decoder, and applying a read voltage to the selected word line, a first voltage to the non-neighboring and non-selected word line, and a second voltage to the neighboring non-selected word line.

13. The memory system of claim 12, wherein the
the second sub-decoder is configured to receive the row address and decode the neighboring non-selected word line corresponding to the row address.

14. The memory system of claim 12, wherein the
the second sub-decoder is configured to receive data identifying the selected word line from the first sub-decoder and decode the neighboring non-selected word line corresponding to the data identifying the selected word line.

15. The memory system of claim 12, wherein the word line driver comprises a plurality of sub-word line drivers each respectively configured to receive data identifying the selected word line and the neighboring non-selected word line from the word line decoder, and apply a voltage selected from a group of voltages including a read voltage, a first voltage, and a second voltage to a corresponding word line.

16. The memory system of claim 12, wherein the second voltage is higher than the first voltage.

17. The memory system of claim 12, wherein the neighboring non-selected word line is adjacent to the selected word line.

18. A method of reading data in the flash memory device, comprising:
receiving the row address, decoding a selected word line using a first sub-decoder of a word line decoder, and decoding a neighboring non-selected word line which is distinguished from a non-neighboring and non-selected word line using a second sub-decoder; and
in response to data identifying the selected word line and the neighboring non-selected word line, applying a read voltage to the selected word line, a first voltage to non-selected word lines other than the neighboring non-selected word line, and a second voltage to the neighboring non-selected word line.

19. The method of claim 18, wherein the second voltage is higher than the first voltage.

20. The method of claim 18, wherein the neighboring non-selected word line is adjacent to the selected word line.

* * * * *